(12) United States Patent
Lo et al.

(10) Patent No.: US 7,192,489 B2
(45) Date of Patent: Mar. 20, 2007

(54) METHOD FOR POLYMER RESIDUE REMOVAL FOLLOWING METAL ETCHING

(75) Inventors: Chi-Hsin Lo, Hsin-Chu (TW); Fei-Yun Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 372 days.

(21) Appl. No.: 10/428,509

(22) Filed: May 1, 2003

(65) Prior Publication Data
US 2004/0216762 A1    Nov. 4, 2004

(51) Int. Cl.
*B08B 3/00* (2006.01)

(52) U.S. Cl. .............................. 134/27; 134/3; 134/26; 134/28; 216/96; 216/100; 216/103; 216/108; 438/906

(58) Field of Classification Search ................. 134/1.3, 134/3, 34, 26, 27, 28; 216/96, 100, 103, 216/108; 438/906
See application file for complete search history.

(56) References Cited

U.S. PATENT DOCUMENTS

| | | | | |
|---|---|---|---|---|
| 4,298,786 A | * | 11/1981 | Marciniec | 347/204 |
| 6,367,486 B1 | * | 4/2002 | Lee et al. | 134/1.3 |
| 2002/0162578 A1 | * | 11/2002 | Ma et al. | 134/19 |

* cited by examiner

*Primary Examiner*—M. Kornakov
(74) *Attorney, Agent, or Firm*—Tung & Associates

(57) ABSTRACT

A method for removing polymer containing residues from a semiconductor wafer including metal containing features including providing a semiconductor wafer having a process surface including metal containing features said process surface at least partially covered with polymer containing residues; and, subjecting the semiconductor wafer to a series of cleaning steps including sequentially exposing the process surface to at least one primary solvent and at least one intermediate solvent the at least one intermediate solvent comprising an ammonium nitrate containing solution.

20 Claims, 1 Drawing Sheet

METHOD FOR POLYMER RESIDUE REMOVAL FOLLOWING METAL ETCHING

FIELD OF THE INVENTION

This invention generally relates to removal of polymer residues following an etching process and more particularly to a wet polymer stripping (PRS) process whereby polymer residues are removed following a metal etching process.

BACKGROUND OF THE INVENTION

In the fabrication of semiconductor devices multiple layers may be required for providing a multi-layered interconnect structure. During the manufacture of integrated circuits it is common to place material photoresist on top of a semiconductor wafer in desired patterns and to etch away or otherwise remove surrounding material not covered by the resist pattern in order to produce metal conductor runs or other desired features. During the formation of semiconductor devices it is often required that the conductive layers be interconnected through holes in an insulating layer. Such holes are commonly referred to as contact holes, i.e., when the hole extends through an insulating layer to an active device area, or vias, i.e., when the hole extends through an insulating layer between two conductive layers. The profile of a hole is of particular importance since that it exhibits specific electrical characteristics when the contact hole or via is filled with a conductive material. In addition, metal interconnect lines may be formed by selectively anisotropically etching away areas (gaps) in a layer of metal to leave metal interconnect lines which are subsequently covered with a layer of dielectric insulating material to fill the gaps.

In anisotropic etching processes, such as those using halocarbon containing plasmas, polymer deposition on the sidewalls and bottom surface of the feature being etched occurs simultaneously with the etching of the oxide or the metal, as the case may be. Surfaces struck by the ions at a lower rate tend to remove the nonvolatile polymeric residual layer at a lower rate, thereby at steady state, leaving a layer of nonvolatile polymeric or metal-polymeric residue on surfaces such as the sidewalls of the etched features, thereby protecting such surfaces against etching by the reactive gas. As such, etching is performed preferentially in a direction perpendicular to the wafer surface since the bottom surfaces etch at a higher rate than the polymeric residue containing sidewalls (i.e., anisotropic etching). If metal is being etched, for example, in etching metal lines, metal will simultaneously deposit with the polymer thus forming a metal-polymer residue on the sidewalls of the etched opening.

In a typical process, for example, an overlying photoresist layer is photolithographically patterned to anisotropically etch the semiconductor features in an underlying layer, for example a metal layer for metal interconnect line etching or an insulating dielectric layer for etching damascene features such as vias or contact holes. After the features are etched, the photoresist mask which remains overlying the upper surface of the etched features may be removed by a dry etching method known as a reactive ion etch (RIE) or ashing process in a quartz chamber using a plasma of $O_2$ or a combination of $CF_4$ and $O_2$ to react with the photoresist material.

It has been the practice in the art to remove at least a portion of the photoresist in-situ by an ashing process following an etching procedure where metal is exposed, for instance after anisotropically etching the metal conductive layer, since exposure of the metal to atmospheric conditions can cause metallic corrosion. In such an in-situ ashing process, the photoresist removal may take place by a reactive ion etching (RIE) method using an oxygen containing plasma in a stripper chamber module of a metal etcher such as, for example, the LAM TCP 9600 DSQ Stripper Chamber. The LAM Research TCP 9600 single wafer metal etcher is an example of a state-of-the-art single wafer RIE or plasma etch tool for etching metal conductor patterns. The Stripper Chamber is just one module in a series of modules included a metal etching apparatus as in, for example, the LAM TCP 9600.

A processing difficulty arises, however, when a metal-polymer residue forms upon etching a semiconductor feature. In a typical etching process, for example, in etching via openings, etching takes place through the inter-metal dielectric (IMD) layer to expose an underlying metallic contact. Typically the metallic portion is over etched to assure adequate contact of the via opening (which will later be filled with a metallic material) with the underlying metal contact layer. As a result, during the etching process, a metal-polymer residue is formed on the sidewalls of an etched opening that cannot be removed by the reactive ion etching (RIE) or ashing process.

Further, the RIE ashing process to remove the overlying photoresist may tend to oxidize the metal-polymer residue formed on the sidewalls of an etched opening thereby making it even more resistant to an RIE cleaning process. As a result, the metal-polymer residue formed on the sidewalls of an etched opening cannot be successfully removed by an RIE process and must be removed by an ex-situ wet process. It has been found necessary in the art to remove the process wafers from the metal etcher, to subject the process wafers with the metal-polymer residue to a wet polymer strip process (PRS) to remove the metal-polymer residue.

FIG. 1A shows a typical wet polymer strip process (PRS) bench configuration 100. In a typical wet chemical polymer stripping process, wafers in a typical process are transferred for processing at one or more wet chemical bunch process lines. In an exemplary process, for example, a first wet, chemical bench process line shown in FIG. 1A includes immersing the process wafers in a plasma etching cleaning solution at one or more stations e.g., 102A, 102B, using for example, ACT available from Ashland Chemical composed of DMSO (Dimethyl-sulphur-oxide), MHA (Mono-Ethyl-Amine) and catechol typically provided at an elevated temperature (e.g., ACT690C™). The process waters are then typically immersed in a native oxide etching solution (NOE) typically composed at hydrogen fluoride (HF), ammonium fluoride ($NH_4F$), and deionized water at station 104A followed by a QDR (quick dump rinse) in deionized water at station 106, a soak in deionized water at one or more pool stations e.q., 108, and finally transferred to a water drying station 110.

Referring to FIG. 1B, in a second typical process the wafers are transferred to a second wet chemical bench line process 112 involving the same series of cleaning steps and chemicals except that a neutralizing solution of n-methyl pyrrolidone (NMP) at station 104B as shown in FIG. 1B replaces the NOE solution at 104A in FIG. 1A.

One problem with the prior art wet chemical polymer stripping process is that the neutralizing solution NMP which helps prevent corrosion to the metal containing semiconductor features has an anti-corrosive action limited to about 12 hours. Additionally, the fluorine containing NOE solution may tend to cause etching damage to semiconductor features, for example, via sidewalls. Moreover, the costs of both the NMP and NOE solutions are relatively high with an increased cost due to the environmental protection procedures associated with the use of the fluorine containing NOE solution including fluorine recovery procedures. A further shortcoming is that the NOE treatment may frequently cause damage to the metal containing portions of the process wafer due to insolubility of the ACT solution leading to localized preferential etching.

There is therefore a need in the semiconductor processing art to develop an improved wet chemical polymer stripping method whereby polymer residues may be more cost effectively removed with minimal damage to semiconductor features.

It is therefore an object of the invention to provide an improved wet chemical polymer stripping method whereby polymer residues may be more cost effectively removed with minimal damage to semiconductor features while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for removing polymer containing residues from a semiconductor wafer including metal containing features.

In a first embodiment, the method includes providing a semiconductor wafer having a process surface including metal containing features said process surface at least partially covered with polymer containing residues; and, subjecting the semiconductor wafer to a series of cleaning steps including sequentially exposing the process surface to at least one primary solvent and at least one intermediate solvent the at least one intermediate solvent comprising an ammonium nitrate containing solution.

In related embodiments, the step of providing a semiconductor wafer includes following a plasma metal etching process for etching the metal containing features. Further, the primary solvent is a wet etchant solution. Further yet, the wet etchant solution includes at least one of Dimethyl-sulphur-oxide, Mono-Ethyl-Amine and catechol.

In yet other related embodiments, the ammonium nitrate containing solution includes a concentration of about 0.5 percent to about 2 percent by volume of ammonium nitrate. Further, the ammonium nitrate containing solution includes a concentration of about 1 percent by volume of ammonium nitrate. Further yet, the ammonium nitrate containing solution includes deionized water and ammonium nitrate.

In further related embodiments, exposing the process surface includes at least one of immersing and spraying the process surface. Further, immersing the process surface includes immersing the semiconductor wafer in at least one solution bath of the at least one intermediate solvent for a period of about 5 minutes to about 15 minutes. Further yet, the at least one solution bath is simultaneously agitated while immersing the semiconductor wafer.

In separate related embodiments, the series of cleaning steps includes exposing the process surface to at least one rinsing solution following the step of exposing the process surface to at least one intermediate solvent. Further, the ammonium nitrate containing solution is maintained at a temperature of from about 75 degrees Centigrade to about 150 degrees Centigrade.

These and other embodiments, aspects and features of the invention will become better understood from a detailed description of a preferred embodiment of the invention which is described in conjunction with the accompanying drawings.

DETAILED DESCRIPTION OF THE PREFERRED EMBODIMENTS

Figure 1A:
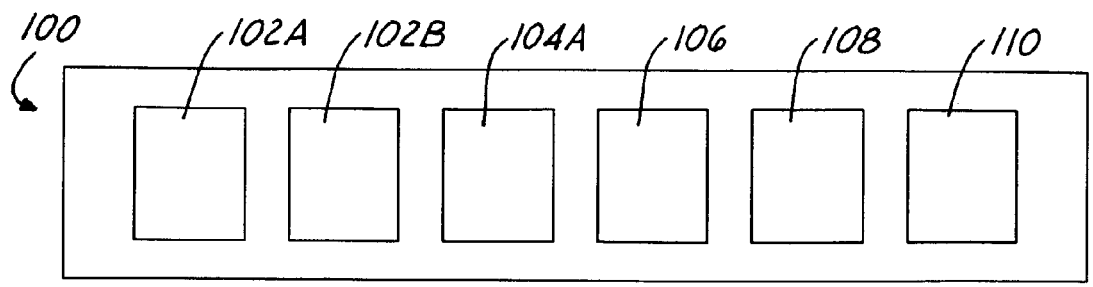
FIGS. 1A and 1B are schematic representations of a typical wet chemical bench process line for a polymer stripping process according to the prior art.
Figure 1B:
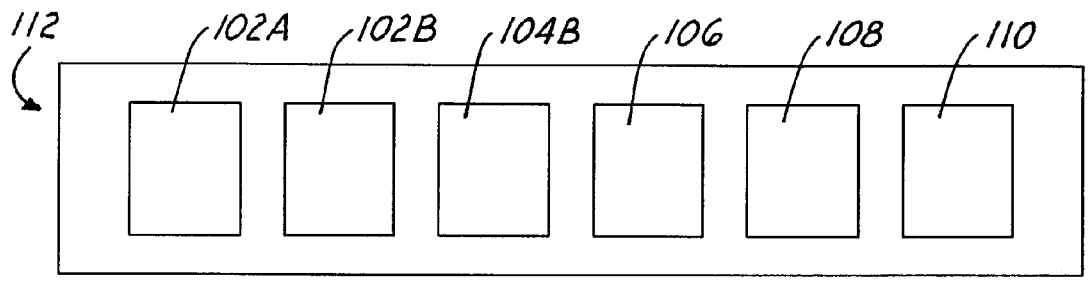

The method of the present invention is explained with reference to an exemplary wet chemical polymer stripping process according to an exemplary wet chemical bench process line following a metal etching process including, for example, a halocarbon reactive ion etching (RIE) process. It will be appreciated that while the method of the present invention is advantageously used following an RIE metal etching process, that the method of the present invention may be used in any semiconductor wafer manufacturing process where removal (stripping) of polymeric residues from the semiconductor wafer process surface is desirable while minimizing corrosive damage to semiconductor features including metal containing semiconductor features. Further, it will be appreciated that the order of the cleaning steps in the wet chemical polymer stripping process as described according to the wet chemical bench line process may be altered or additional steps added as long as the intermediate solvent according to the method of the present invention is used in one or more of the cleaning steps.

In a first embodiment according to the present invention, a semiconductor wafer including polymeric residues is subjected a wet chemical polymer stripping (removal) process including at least one cleaning step having an intermediate solvent including ammonium nitrate ($NH_4NO_3$). Preferably the ammonium nitrate is present at a concentration of from about 0.5 percent to about 2 percent by volume, more preferably about 1 percent by volume (i.e. 1% ammonium nitrate solution). For example, the ammonium nitrate solution may be diluted from a higher concentration solution to about 1 percent by volume in deionized water. Preferably, the ammonium nitrate solution is an intermediate solvent included in a series of cleaning steps, for example, following a cleaning step with a primary solvent. The cleaning steps may include commonly known processes in the art including dipping or immersing the semiconductor wafer into a solution for a period of time with or without simultaneous application of agitation including sonic energy, for example, megasonic energy having a frequency of about 850 MHz to about 900 MHz. Preferably, the series of cleaning steps at least includes dipping the semiconductor wafer in a solution for a period of time according to a wet chemical bench cleaning process.

Preferably, the semiconductor wafer includes newly exposed metal features, for example, following an RIE etching process. The metal features may include any metal including for example, tungsten, aluminum, and copper, and alloys thereof. It will be appreciated that the polymer residues may include polymeric-metal residues originating from plasma etching (RIE) of the semiconductor features including, for example, via openings or metal interconnect lines. The plasma etching process, for example, includes halogen containing species including bromine and chlorine, for example HBr and HCl, as is known in the art for plasma metal etching processes. Further, the semiconductor wafer may optionally be subjected to an RIE ashing process to remove at least a portion of the photoresist and polymeric residues prior to the wet chemical polymer stripping (removal) process according to the present invention.

In another embodiment of the invention, the semiconductor water is first subjected to one or more cleaning (wet etching) steps in a primary solvent, for example, including a commercially available solvent (wet etchant) referred to as ACT, including DMSO (Dimethyl-sulphur-oxide), MEA (Mono-Ethyl-Amino) and catechol. Preferably the primary solvent includes at least one of DMSO (Dimethyl-sulphur-oxide), MEA (Mono-Ethyl-Amino) and catechol. The ACT™ (hereinafter ACT), for example, is typically provided at an elevated temperature, for example between about 75° C. and about 150°. Preferably, the cleaning step including the ammonium nitrate solution for neutralizing the primary solvent is performed following the wet etching step in the ACT (primary) solvent.

In further embodiments of the present invention, the wet chemical polymer stripping process includes cleaning steps subsequent to the cleaning step including the ammonium nitrate containing solution, including for example one or more rinsing and soaking steps including immersing (dipping) the semiconductor wafer in deionized water for a period of time with or without simultaneous application of sonic energy.

It will be appreciated that any of the cleaning steps may include one or more solution baths for immersing the semiconductor wafer and that the solution baths may be provided at elevated temperatures as is known in the art.

Figure 2:
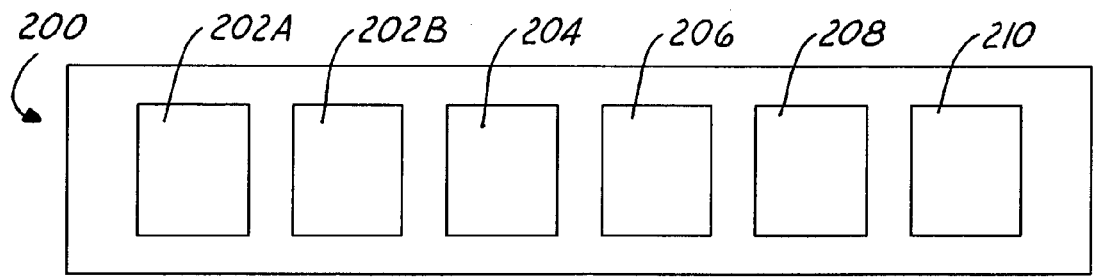
FIG. 2, is a schematic representation of a wet chemical bench process line for a polymer stripping process according to an embodiment the present invention.

Referring to FIG. 2 is a schematic representation of an exemplary wet chemical bench line 200 for carrying out a wet chemical polymer removal process according to the present invention. In operation, by way of example, the process wafer is first dipped (immersed) into a primary solvent, for example, an ACT solution bath 202A for conducting a first etch reaction. The ACT solution is normally maintained at a temperature within a range of about 75° C. to about 150° C. After a suitable time period of immersion in the ACT solution, for example, about 15 minutes, the wafer is moved to a second ACT bath 202B maintained at a temperature within a range of about 75° C. to about 150° C. where it is again immersed for a suitable length of time, for example, about 15 minutes.

According to the present invention, the process wafer is then immersed in a neutralizing bath 204 including an ammonium nitrate solution having from about 0.5 percent to about 2 percent by volume of ammonium nitrate, more preferably about 1 percent by volume of ammonium nitrate to substantially neutralize the residual acidic ACT solution remaining on the wafer surface. The ammonium nitrate solution is preferably maintained in a temperature range of about 75° C. to about 150° C. The wafer is immersed in the ammonium nitrate solution for a sufficient length of time to substantially neutralize the ACT, which may range from about 5 to about 15 minutes. It will be appreciated more than one ammonium nitrate solution bath maintained at different temperatures may be used according to the present invention.

The process wafer is then preferably immersed (dipped) in rinse bath 206 of deionized water for rinsing with deionized water. Following the immersion in rinse in bath 206 a final rinse or soak may optionally be performed in deionized water bath 208 prior to transferring the wafer to a drying chamber 210 for wafer drying.

A robot arm or any other conventional remote operation means may be used to transport the wafers into various baths. Further, it will be appreciated that the remote operation means may be programmed so that the baths may be accessed more than once or in any order. The sequence for wafer transfer among the various solution baths is preferably programmed and may be performed in any desired sequence as will be readily determined by those skilled in the art. In addition it will be appreciated that the wet chemical bench process line may include a means for controlling the ambient environment, for example, controlling humidity and oxygen levels as well as providing filtered re-circulated ambient as is known in the art.

Figure 3:
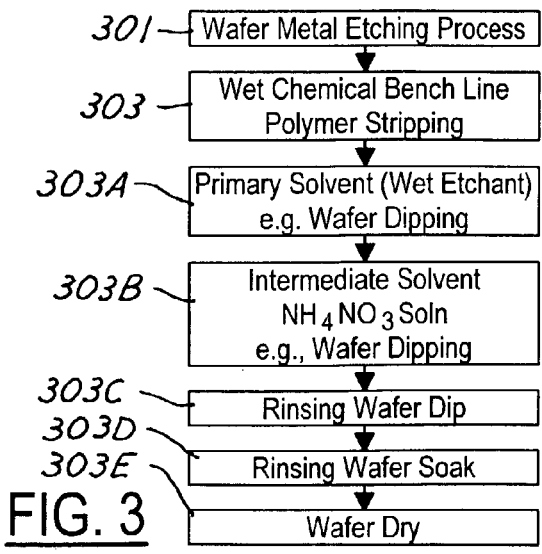
FIG. 3, is a process flow diagram including several of the embodiments of the wet chemical polymer stripping method according to the present invention.

Referring to FIG. 3 is a process flow diagram including several embodiments of the present invention. Following metal etching process 301 the semiconductor wafer is transferred to wet chemical bench process line for polymer stripping process 303 which includes an ammonium nitrate intermediate solvent according to the present invention. Included in the wet chemical bench line polymer stripping process 303 are a series of cleaning steps whereby the process wafer is first treated at least once (e.g., dipped) with a primary solvent (wet etchant), e.g., ACT in cleaning step 303A followed by treatment (e.g., dipping) at least once with the intermediate solvent including ammonium nitrate according to the present invention in process 303B. Following the intermediate solvent treatment, the process wafer is transferred to one or more rinsing stations for rinsing (e.g., dipping) with deionized water, e.g., rinsing process 303C and soaking process 303D, followed by transfer to drying station 303E for drying the process wafer.

The advantages of the present invention where an ammonium nitrate solution is used as the intermediate solvent in a polymer stripping process according to the present invention include:

1) No damage results to metal containing or other semiconductor features from the polymer stripping process using the ammonium nitrate solution.
2) The ammonium nitrate solution is a lower cost intermediate solvent compared to NOE or NMP solutions by a factor of at least about 100 to 500.
3) Use of the ammonium nitrate solution as an intermediate solvent gives improved polymer residue removal compared to NOE or NMP intermediate solvents and provides anti-corrosion protection for longer periods, for example, more than about 24 hours.
4) The ammonium nitrate solution has superior buffering properties allowing maintenance of a stable pH.
5) The ammonium nitrate solution solvates ACT avoiding residual etchant remaining on features causing etching damage.
6) The ammonium nitrate solution is presents less environmental concerns compared to NOE including avoiding the necessity of special handling procedures related to fluorine containing solvents.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for removing polymer containing residues from a semiconductor wafer while avoiding etching of exposed metal containing features comprising the steps of:
providing a semiconductor wafer having a process surface including exposed metal containing features said process surface at least partially covered with polymer containing residues; and
subjecting the semiconductor wafer to a series of cleaning steps including sequentially exposing the process surface to at least one acidic primary solvent for etching said polymer containing residues and at least one intermediate solvent the at least one intermediate solvent comprising an ammonium nitrate containing solution to neutralize said primary solvent etchant.

2. The method of claim 1, wherein said exposed metal features are formed by a plasma metal etching process.

3. The method of claim 1, wherein the primary solvent comprises Dimethyl-sulphur-oxide, Mono-Ethyl-Amine and catechol.

4. The method of claim 1, wherein the ammonium nitrate containing solution includes a concentration of about 0.5 percent to about 2 percent by volume of ammonium nitrate.

5. The method of claim 4, wherein the ammonium nitrate containing solution includes a concentration of about 1 percent by volume of ammonium nitrate.

6. The method of claim 1, wherein the ammonium nitrate containing solution includes deionized water and ammonium nitrate.

7. The method of claim 1, wherein exposing the process surface includes at least one of immersing and spraying the process surface.

8. The method of claim 7, wherein immersing the process surface includes immersing the semiconductor wafer in at least one solution bath of the at least one intermediate solvent for a period of about 5 minutes to about 15 minutes.

9. The method of claim 7, wherein the at least one solution bath is simultaneously agitated while immersing the semiconductor wafer.

10. The method of claim 1, wherein the series of cleaning steps includes exposing the process surface to at least one rinsing solution following the step of exposing the process surface to at least one intermediate solvent.

11. The method of claim 1, wherein the ammonium nitrate containing solution is maintained at a temperature of from about 75 degrees Centigrade to about 150 degrees Centigrade.

12. A method for removing polymer containing residues from a semiconductor wafer while avoiding etching exposed metal containing features following a reactive ion (RIE) metal etching process comprising the steps of:
providing a semiconductor wafer having a process surface including exposed metal containing features, said process surface at least partially covered with polymer containing residues following a metal RIE process; and
subjecting the semiconductor wafer to a series of cleaning steps including sequentially exposing the process surface to at least one acidic primary solvent for wet etching said polymer containing residues and at least one intermediate solvent for neutralizing the primary solvent, the at least one intermediate solvent comprising an ammonium nitrate solution having a concentration of ammonium nitrate between about 0.5 percent and about 2 percent by volume.

13. The method of claim 12, wherein the primary solvent includes at least one of Dimethyl-sulphur-oxide, Mono-Ethyl-Amine and catechol.

14. The method of claim 12, wherein the ammonium nitrate solution includes a concentration of about 1 percent by volume of ammonium nitrate.

15. The method of claim 14, wherein the ammonium nitrate solution includes deionized water and ammonium nitrate.

16. The method of claim 12, wherein the step including exposing the process surface includes at least one of immersing and spraying the process surface.

17. The method of claim 16, wherein the step including exposing the process surface includes immersing the semiconductor wafer in at least one solution bath of the least one intermediate solvent for a period of about 5 minutes to about 15 minutes.

18. The method of claim 17, wherein the at least one solution bath is maintained at a temperature of from about 75 degrees Centigrade to about 150 degrees Centigrade.

19. The method of claim 12, wherein the series of cleaning steps includes exposing the process surface to at least one rinsing solution following the step of exposing the process surface to at least one intermediate solvent.

20. The method of claim 12, wherein the series of cleaning steps is performed in a wet chemical bench process line having a controlled ambient environment.

* * * * *